United States Patent
Venugopal et al.

(10) Patent No.: US 11,303,268 B2
(45) Date of Patent: Apr. 12, 2022

(54) SEMI DYNAMIC FLOP AND SINGLE STAGE PULSE FLOP WITH SHADOW LATCH AND TRANSPARENCY ON BOTH INPUT DATA EDGES

(71) Applicant: Apple Inc., Cupertino, CA (US)

(72) Inventors: Vivekanandan Venugopal, San Jose, CA (US); Ajay Kumar Bhatia, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/173,055

(22) Filed: Feb. 10, 2021

(65) Prior Publication Data

US 2021/0167759 A1 Jun. 3, 2021

Related U.S. Application Data

(63) Continuation of application No. 16/143,973, filed on Sep. 27, 2018, now abandoned.

(51) Int. Cl.
*H03K 3/037* (2006.01)
*H03K 19/096* (2006.01)
*H03K 3/64* (2006.01)

(52) U.S. Cl.
CPC ............ *H03K 3/0372* (2013.01); *H03K 3/64* (2013.01); *H03K 19/096* (2013.01)

(58) Field of Classification Search
None
See application file for complete search history.

(56) References Cited

U.S. PATENT DOCUMENTS

| | | | |
|---|---|---|---|
| 5,148,052 A | 9/1992 | Yellamilli | |
| 5,250,852 A | 10/1993 | Ovens et al. | |
| 5,349,255 A | 9/1994 | Patel | |
| 5,378,934 A | 1/1995 | Takahashi et al. | |
| 5,552,738 A * | 9/1996 | Ko | H03K 3/037 327/203 |
| 5,656,962 A | 8/1997 | Banik | |
| 5,767,716 A * | 6/1998 | Ko | H03K 3/012 327/203 |
| 5,926,396 A | 7/1999 | Ohara | |
| 6,501,315 B1 * | 12/2002 | Nguyen | H03K 3/012 327/203 |
| 6,518,810 B1 * | 2/2003 | Takahashi | H03K 3/012 327/202 |
| 6,661,121 B2 | 12/2003 | Gregor et al. | |

(Continued)

*Primary Examiner* — Thomas J. Hiltunen
(74) *Attorney, Agent, or Firm* — Kowert Hood Munyon Rankin and Goetzel PC; Rory D. Rankin

(57) ABSTRACT

A system and method for efficiently storing and driving data between pipeline stages. In various embodiments, a flip-flop circuit includes a bypass circuit, which is a tri-state inverter, and the bypass circuit receives a clock signal and a version of a data signal. When the clock signal received by the flip-flop circuit is asserted, the output of the bypass circuit is sent as the output of the flip-flop circuit. In one example, the version of the data signal received by the bypass circuit is the data signal. In another example, the version of the data signal received by the bypass circuit is the output of a master latch. Although the output of the master latch is pre-charged, when the clock is asserted, each of a late arriving rising and falling data transition are included in the critical path of the flip-flop circuit.

20 Claims, 7 Drawing Sheets

(56) References Cited

U.S. PATENT DOCUMENTS

| | | |
|---|---|---|
| 6,831,495 B2 | 12/2004 | Correale, Jr. et al. |
| 7,319,344 B2 | 1/2008 | Klass |
| 7,427,875 B2 | 9/2008 | Kim et al. |
| 7,725,792 B2 | 5/2010 | Garg et al. |
| 8,067,970 B2 | 11/2011 | Masleid |
| 8,497,721 B1 | 7/2013 | Partovi et al. |
| 8,631,213 B2 | 1/2014 | Biswas et al. |
| 8,656,238 B2 * | 2/2014 | Lee .................. G06F 11/24 714/731 |
| 8,922,460 B2 | 12/2014 | Tsuchi |
| 8,975,933 B1 | 3/2015 | Holzman |
| 9,425,771 B2 | 8/2016 | Nandi et al. |
| 9,680,450 B2 * | 6/2017 | Bailey .............. H03K 3/356173 |
| 9,911,470 B2 | 3/2018 | Kottapalli et al. |
| 10,049,177 B1 * | 8/2018 | Devlin ................ G06F 30/34 |
| 10,338,136 B2 | 7/2019 | Wang et al. |
| 10,340,898 B1 * | 7/2019 | Ganusov ............ H03K 3/0372 |
| 2005/0280459 A1 * | 12/2005 | Inoue .................... H03K 3/012 327/203 |
| 2008/0218233 A1 | 9/2008 | Yamamoto et al. |
| 2015/0207496 A1 | 7/2015 | Seningen |
| 2019/0089337 A1 | 3/2019 | Venugopal et al. |
| 2020/0106424 A1 | 4/2020 | Venugopal et al. |

* cited by examiner

SEMI DYNAMIC FLOP AND SINGLE STAGE PULSE FLOP WITH SHADOW LATCH AND TRANSPARENCY ON BOTH INPUT DATA EDGES

CROSS REFERENCE TO RELATED APPLICATIONS

This application is a continuation of U.S. patent application Ser. No. 16/143,973, entitled "SEMI DYNAMIC FLOP AND SINGLE STAGE PULSE FLOP WITH SHADOW LATCH AND TRANSPARENCY ON BOTH INPUT DATA EDGES", filed Sep. 27, 2018, the entirety of which is incorporated herein by reference.

BACKGROUND

Technical Field

Embodiments described herein relate to the field of computing systems and, more particularly, to efficiently storing and driving data between pipeline stages.

Description of the Related Art

Sequential elements are used for storing and driving data in a variety of circuits such as general-purpose central processing unit (CPU), data parallel processors like graphics processing units (GPUs), digital signal processors (DSPs), and so forth. Modern processors are typically pipelined. For example, the processors include one or more data processing stages connected in series with sequential elements placed between the stages for storing and driving the data. The output of one stage is made the input of the next stage during each transition of a clock signal. The sequential elements typically are flip-flop circuits.

A processor's performance is dependent at least upon the operating frequency of a clock signal. The duration of a clock cycle period corresponding to the operating frequency is determined by the amount of time required for processing of data between the flip-flop circuits. The clock cycle period increases based at least upon the setup time and the clock-to-output delay of the flip-flop circuit. A variety of versions of flip-flop circuits are designed for different end purposes. Flip-flop circuits designed for low latency typically favor one input data transition between a rising and a falling edge transition while eliminating the other transition from the critical path. The tradeoff is design flexibility is reduced while also the setup overhead still exists.

In view of the above, methods and mechanisms for efficiently storing and driving data between pipeline stages are desired.

SUMMARY

Systems and methods for efficiently storing and driving data between pipeline stages are contemplated. In various embodiments, a flip-flop circuit used between pipeline stages of a processor includes a master latch, which receives a clock signal and a data signal, and a shadow latch, which receives an output of the master latch and a clock signal. In addition, the flip-flop circuit includes a bypass circuit capable of receiving the clock signal and a version of the data signal. When the clock signal is asserted, the output of the master latch is sent to the shadow latch, and the output of the shadow latch is prevented from being sent as an output of the flip-flop circuit. Rather, the output of the bypass circuit is sent as the output of the flip-flop circuit. In various embodiments, the bypass circuit is a tri-state inverter used to reduce the clock-to-output delay of the flip-flop circuit.

In some embodiments, the version of the data signal received by the bypass circuit is the data signal. Therefore, the data signal is received by each of the master latch and the bypass circuit. In an embodiment, the clock signal is a pulse signal generated from a source clock signal, and each of the master latch, the shadow latch and the bypass circuit receive the pulse signal.

In some embodiments, the version of the data signal received by the bypass circuit is the output of the master latch. In an embodiment, the output of the master latch is pre-charged to a Boolean logic high level when the clock is negated. Although the output of the master latch is pre-charged, when the clock is asserted, each of a late arriving rising and falling data transition are included in the critical path of the flip-flop circuit.

In some embodiments, the bypass circuit is a tri-state inverter with the rising input data transition gated by the clock signal, but with the falling input data transition remaining ungated by the clock signal. When the clock signal is asserted, the path from the output of the master latch through the bypass circuit to the output of the flip-flop circuit reduces the clock-to-output delay of the flip-flop circuit. A sequential feedback circuit in the master latch receives a delayed version of the clock signal while a sequential feedback circuit in the shadow latch receives the clock signal.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which.

Figure 1:
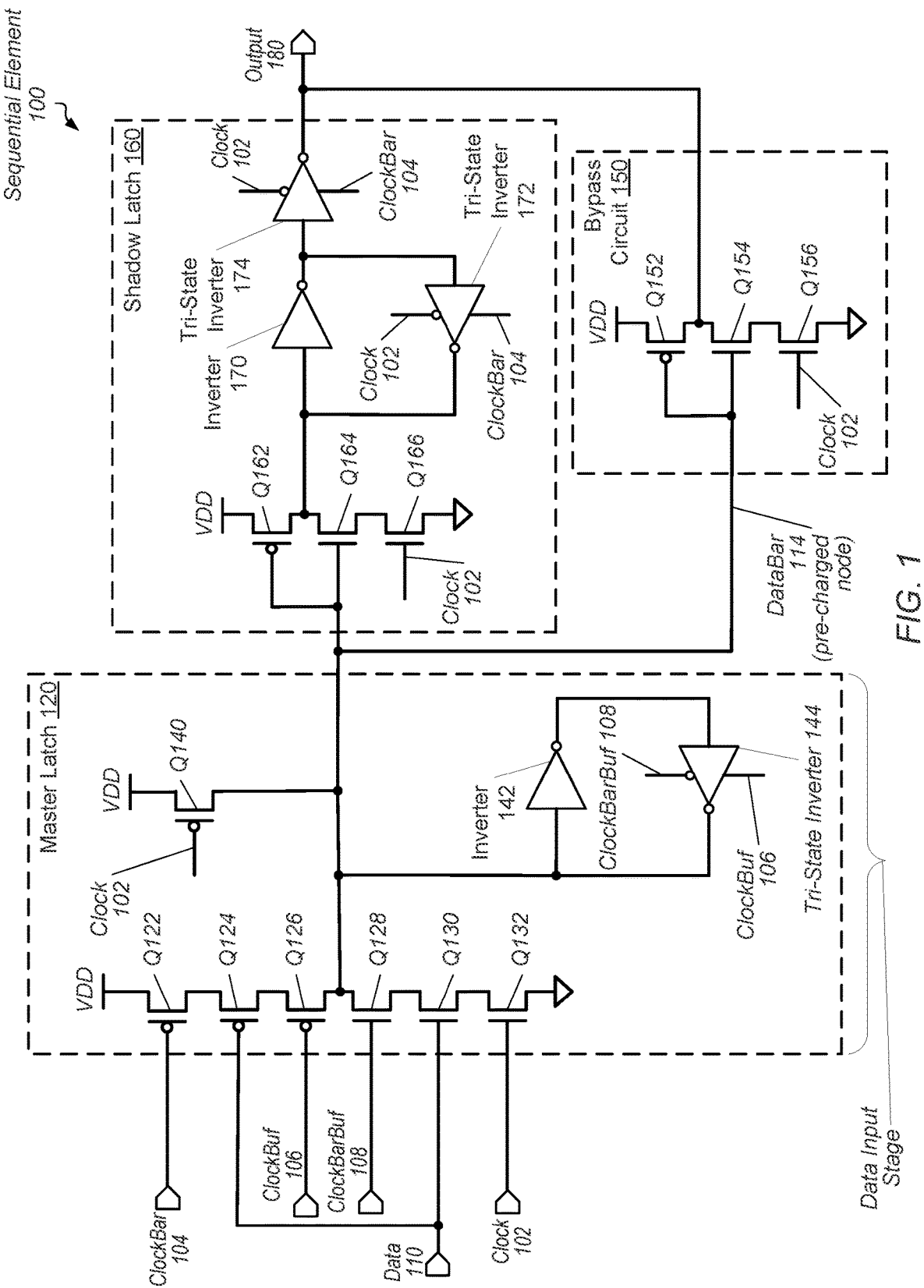
FIG. 1 is a block diagram of one embodiment of a sequential element.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Referring to FIG. 1, a generalized block diagram of one embodiment of a sequential element 100 is shown. In the illustrated embodiment, sequential element 100 includes a master latch 120, a shadow latch 160 and a bypass circuit 150. As shown, sequential element receives a data signal 110 (or Data 110), a clock signal 102 (or Clock 102), an inverted level of clock 102, which is ClockBar 104, a delayed (and buffered) version of Clock 102, which is ClockBuf 106, and an inverted level of ClockBuf 106, which is ClockBarBuf 108. With the received inputs, sequential element 100 generates Output 180. In various embodiments, sequential element 100 is used between pipeline stages of a processor. In some embodiments, sequential element 100 is a flip-flop circuit.

As used herein, a "shadow latch" refers to a latch with a tri-state output. Each of the shadow latch 160 and the bypass circuit 150 receives the output from the master latch 120, which is DataBar 114. The master latch 120 is a data input stage of the sequential element 100. As shown, only one of the shadow latch 160 and the bypass circuit 150 sets a voltage level on Output 180. When Clock 102 is negated, the shadow latch 160 sets the voltage level on Output 180 and the bypass circuit 150 is disabled. For example, when Clock 102 is negated with a logic low level, the pre-charge device Q140 (a PFET) pre-charges the dynamic node DataBar 114 to a logic high level, which disables device Q152 (a PFET) in the bypass circuit 150. The device Q156 (an NFET) is disabled by Clock 102. Therefore, the bypass circuit 150 does not set a voltage level on its output, which is Output 180, and the bypass circuit 150 is considered disabled or tri-stated. When Clock 102 is asserted, the shadow latch 160 is prevented from sending an output to Output 180. In addition, when Clock 102 is asserted, the bypass circuit 150 sends an inverted level of DataBar 114 to Output 180.

When Clock 102 is asserted with a logic high level, the path from the output of the master latch, which is DataBar 114, through the bypass circuit 150 to Output 180 reduces the clock-to-output (clk-to-q) delay of the sequential element 100. Before providing further details of the components included in the master latch 120, the shadow latch 160 and the bypass circuit 150, a description of terms used to describe them is next provided.

As used herein, a "device" refers to a resistor, a transistor, or other suitable type of transconductance device coupled between a circuit node and either a power node or a ground node. In addition, as used herein, a "logic low level," a "logic 0 value," or a "Boolean logic low level" corresponds to a voltage level sufficiently low to enable a p-type metal oxide semiconductor (MOS) field effect transistor (FET), which is also referred simply as a "PFET." Similarly, a "logic high level," a "logic 1 value," or a "Boolean logic high level" corresponds to a voltage level sufficiently high to enable an n-type metal oxide semiconductor (MOS) field effect transistor (FET), which is also referred simply as an "NFET." In various other embodiments, different technology, including technologies other than complementary metal-oxide semiconductor (CMOS), result in different voltage levels for "low" and "high." As used herein, a signal is considered "asserted" when the signal has a particular voltage level used for enabling combinatorial logic or devices. A signal is considered "de-asserted" or "negated" when the signal has a particular voltage level used for disabling combinatorial logic or devices.

In the illustrated embodiment, the master latch 120 receives Data 110 on the gate terminals of devices Q124 (a PFET) and Q130 (an NFET). The clock signals Clock 102 and its inverted version ClockBar 104 are received on the gate terminals of Q132 and Q122, respectively. External circuitry generates delayed versions of Clock 102 and ClockBar 104 such as ClockBuf 106 and ClockBarBuf 108. In an embodiment, a delayed clock generator includes a number of series connected inverters for receiving Clock 102 and generating ClockBar 104, ClockBuf 106 and ClockBarBuf 108. In one embodiment, ClockBar 104 has a one inverter logic gate delay from Clock 102, ClockBuf 106 has a four inverter logic gate delay from Clock 102 and ClockBarBuf 108 has a five inverter logic gate delay from Clock 102. In other embodiments, other numbers of logic gates and types of logic gates are used to generate clocks signals from Clock 102.

Combining the clock signals 102-108 using the devices Q122, Q126, Q128 and Q132 as shown creates a smaller duration of time for transmitting Data 110 for latching by the master latch 120 than a duty cycle of Clock 102. The smaller duration of time is referred to as a "pulse," and it is used to determine a "transparency window" for the sequential element 100. Sequential element 100 is described as being "transparent" or "open" when data is capable of being transmitted from Data 110 through the master latch 120 to DataBar 114, which is received by each of the shadow latch 160 and bypass circuit 150. Sequential element 100 is described as being "opaque" or "closed" when data is incapable of being transmitted from Data 110 through the master latch 120 to DataBar 114.

A figure and a later description of Clock 102, ClockBuf 106 and a pulse are provided in FIG. 2. For example, when Clock 102 is asserted, or set at a logic high level to enable Q132, a relatively short time later, such as the delay of one inverter logic gate (or inverter), ClockBar 104 becomes negated. Since ClockBuf 106 is still at a logic low level due to the previous level of Clock 102, ClockBarbuf 108 is still at a logic high level. Accordingly, the devices Q126 and Q128 are enabled, and an inverted level of Data 110 is capable of being set on DataBar 114. Sequential element 100 is considered to be open. Once the logic high level of Clock 102 is transmitted through multiple logic gate delays in the external clock generator to generate ClockBuf 106, the input ClockBuf 106 transitions from the logic low level to the logic high level, which disables Q126 (a PFET). Similarly, ClockBarBuf 108 transitions from the logic high level to the logic low level, which disables Q12 (an NFET). The measure of time between a first point in time when Clock 102 transitions to the logic high level to a second point in time when the devices Q126 and Q128 become disabled is referred to as the width of the pulse.

As shown, the pre-charge device Q140 (a PFET) is used to pre-charge the dynamic node DataBar 114 when Clock 102 is negated. Although the output of the master latch, which is DataBar 114, is pre-charged, when Clock 102 is again asserted, each of a late arriving rising data transition and a late arriving falling data transition for Data 110 is included in the critical path of the sequential element 100. Typically, semi-dynamic flip-flop circuits remove low-to-high (rising) transitions from the critical path, and consequently, have transparency on only one input data transition. Here, the sequential element 100 uses semi-dynamic circuitry (e.g., master latch 120 is dynamic while shadow latch 160 is static) with transparency for both input data transitions.

The master latch 120 also includes a delayed clock, sequential feedback circuit, which includes inverter 142 and tri-state inverter 144. Inverter 142 receives DataBar 114. Tri-state inverter 144 receives the output of inverter 142 while sending its output to the dynamic node DataBar 114. In the illustrated embodiment, tri-state inverter 144 receives ClockBuf 106 and ClockBarBuf 108, which are delayed clock signals compared to Clock 102. Therefore, the sequential feedback circuit lags behind the front-end of the master latch 120, which incorporates devices Q122-Q132. For example, when the inverted version of Data 110 initially transfers to DataBar 114, the sequential feedback circuit with logic gates 142-144 is still disabled for the period of time until ClockBuf 106 and ClockBarBuf 108 transition following the transition of Clock 102. For example, when Clock 102 transitions to a logic high value to enable device Q132, the sequential feedback circuit with logic gates 142-144 remains disabled until ClockBuf 106 transitions to a logic high level.

The shadow latch 160 receives the output of the master latch 120 using the gate terminals of the devices Q162 (a PFET) and Q164 (an NFET). The device Q166 (an NFET) receives Clock 102. The shadow latch 160 also includes a sequential feedback circuit. This sequential feedback circuit in the shadow latch 160 includes inverter 170 and tri-state inverter 172. Inverter 170 receives the output on the drain terminals of the devices Q162 and Q164. Tri-state inverter 172 receives the output of inverter 170 while sending its output to the input of inverter 170. In the illustrated embodiment, tri-state inverter 172 receives Clock 102 and ClockBar 104, but with Clock 102 being used as an inverted clock to enable PFETs included in tri-state inverter 172 and ClockBar 104 being used to enable NFETs included in tri-state inverter 172.

The output of inverter 170 is received by tri-state inverter 174. Similar to tri-state inverter 172, tri-state inverter 174 receives Clock 102 and ClockBar 104, but with Clock 102 being used as an inverted clock to enable PFETs included in tri-state inverter 174 and ClockBar 104 being used to enable NFETs included in tri-state inverter 174. Therefore, each of tri-state inverters 172 and 174 is disabled when Clock 102 is set at a logic high level, and each of tri-state inverters 172 and 174 is enabled when Clock 102 is set at a logic low level.

Similar to the input stage of the shadow latch 160, the bypass circuit 150 receives the output of the master latch 120 using the gate terminals of the devices Q152 (a PFET) and Q154 (an NFET). The device Q156 (an NFET) receives Clock 102. Therefore, the input of the bypass circuit 150 is a tri-state inverter with the rising input data transition gated by Clock 102, but the falling input data transition remains ungated by Clock 102. As described earlier, when Clock 102 is set at a logic high level, the path from Data 110 through the master latch 120 and through the bypass circuit 150 to Output 180 reduces the clock-to-output (clk-to-q) delay of the sequential element 100. The tri-state inverter 174 being disabled when Clock 102 is set at a logic high level ensures that the shadow latch 160 and the bypass circuit 150 do not contend with one another.

Figure 2:
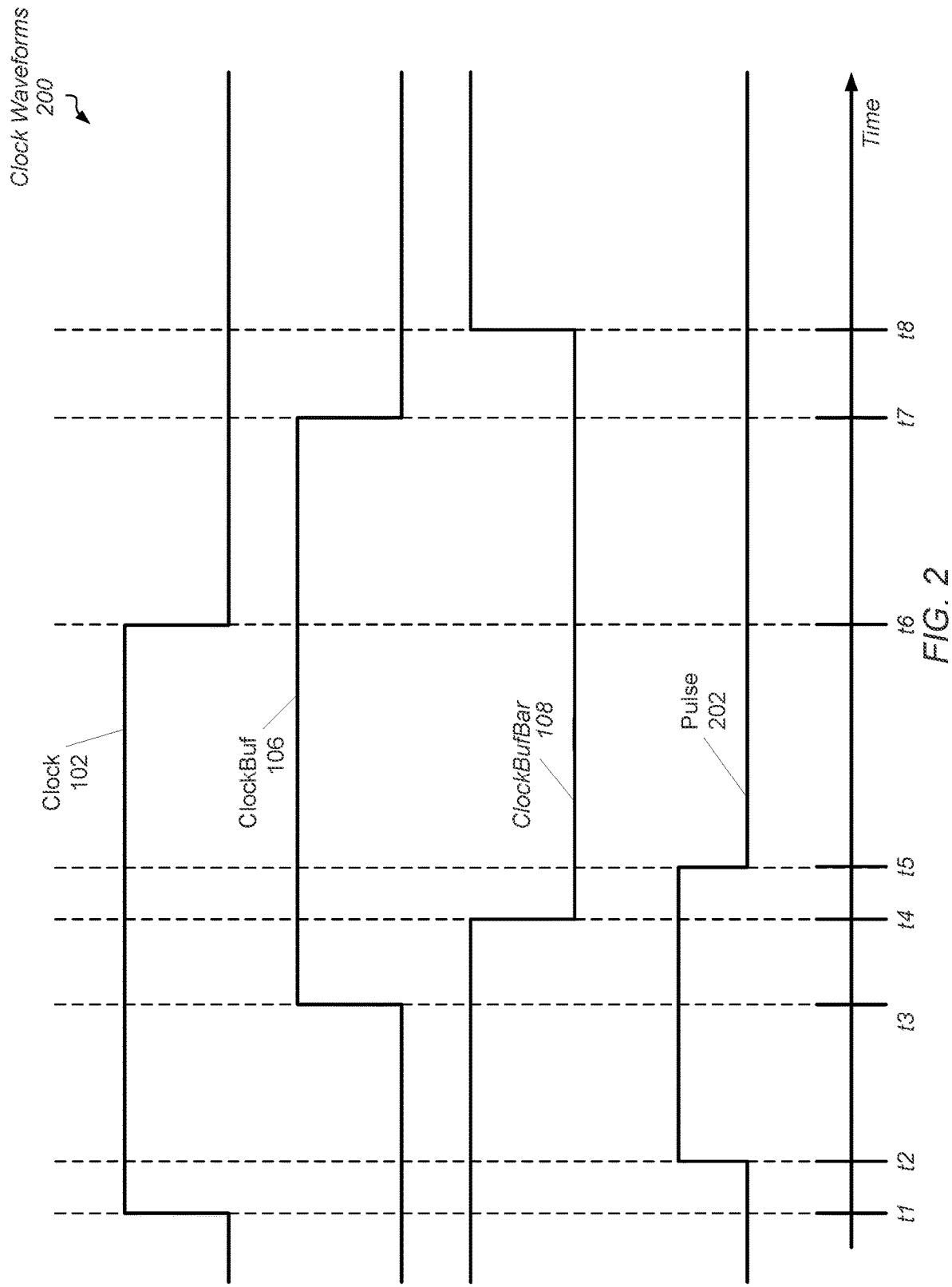
FIG. 2 is a block diagram of one embodiment of clock waveforms.

Referring to FIG. 2, a generalized block diagram of one embodiment of a clock waveforms 200 is shown. In the illustrated embodiment, signals previously described are numbered identically. As shown, Clock 102 transitions from a logic low level to a logic high level (a rising transition) at time t1. As described earlier, a clock generator receives Clock 102 and generates ClockBuf 106 through multiple series connected inverters. In other embodiments, other types of logic gates or other circuitry are used to generate ClockBuf 106 from Clock 102.

As shown, ClockBuf 106 transitions from a logic low level to a logic high level (a rising transition) at time t3. The signal ClockBuf 106 has a similar delay from Clock 102 for falling transitions. As shown, Clock 102 has a falling transition at time t6 and ClockBuf 106 has a falling transition at time t7. ClockBarBuf 108 is an inverted version of ClockBuf 106. When ClockBuf 106 has a rising transition at time t3, ClockBarBuf 108 has a falling transition at time t4, and when ClockBuf 106 has a falling transition at time t7, ClockBarBuf 108 has a rising transition at time t8. In some embodiments, a pulse generator receives one or more inverted versions of Clock 102 and other buffered (delayed) versions of Clock 102, as well as Clock 102.

In an embodiment, the pulse generator combines Clock 102 and one or more of the other received versions of Clock 102 in a Boolean AND gate to generate Pulse 202. As shown, when Clock 102 has a rising transition at time t1, Pulse 202 has a rising transition at time t2, and Pulse 202 has a falling transition at time t5. The pulse width of Pulse 202 is measured between times t2 and t5. The pulse width of Pulse 202 is used to determine a transparency window for a sequential element. The use of Pulse 202 as an input clock signal provides a better setup time, since it is generated at a later time, but the delay also increases the clock-to-output (clk-to-q) delay of a sequential element.

Figure 3:
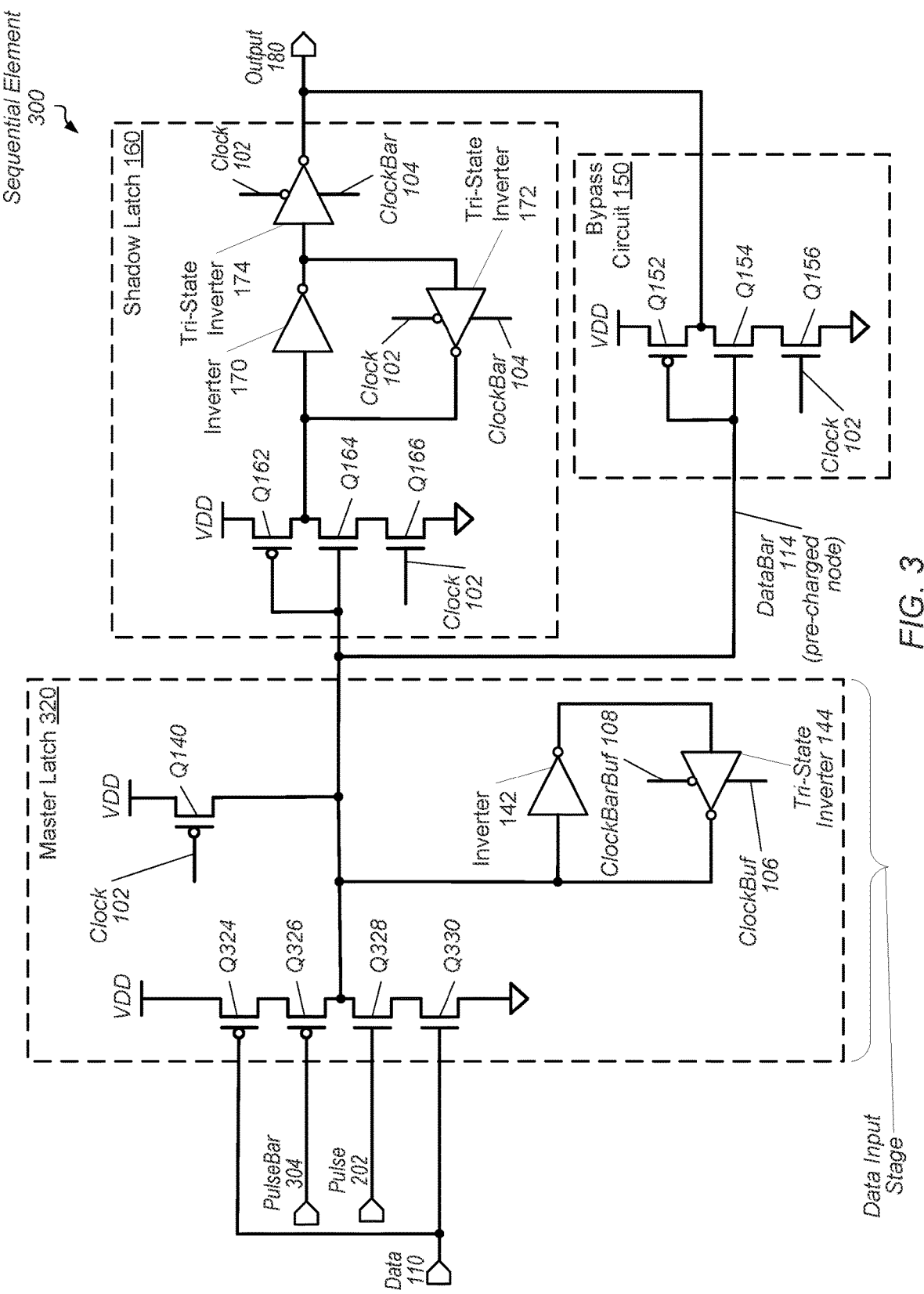
FIG. 3 is a block diagram of another embodiment of a sequential element.

Referring to FIG. 3, a generalized block diagram of another embodiment of a sequential element 300 is shown. Circuitry, logic and signals described earlier are numbered identically. In the illustrated embodiment, the master latch 320 receives Data 110 on the gate terminals of devices Q324 (a PFET) and Q330 (an NFET). The master latch 320 is a data input stage of the sequential element 300. Rather than receive Clock 102, the devices Q326 and Q328 of the master latch 320 uses Pulse 202 and the inverted level of Pulse 202, which is PulseBar 304. Pulse 202 is received on the gate terminal of device Q328 (an NFET) and PulseBar 304 is received on the gate terminal of device Q326 (a PFET). The pulse width of Pulse 202 is used to determine a transparency window for sequential element 300. The use of Pulse 202 as an input clock signal provides a better setup time, but the delay of Pulse 202 also increases the clock-to-output (clk-to-q) delay of sequential element 300. Therefore, in some embodiments, sequential element 100 is selected for use in a design when the clock-to-output latency is prioritized over the setup time, but sequential element 300 is selected for use in a design when the setup time is prioritized over the clock-to-output latency.

Figure 4:
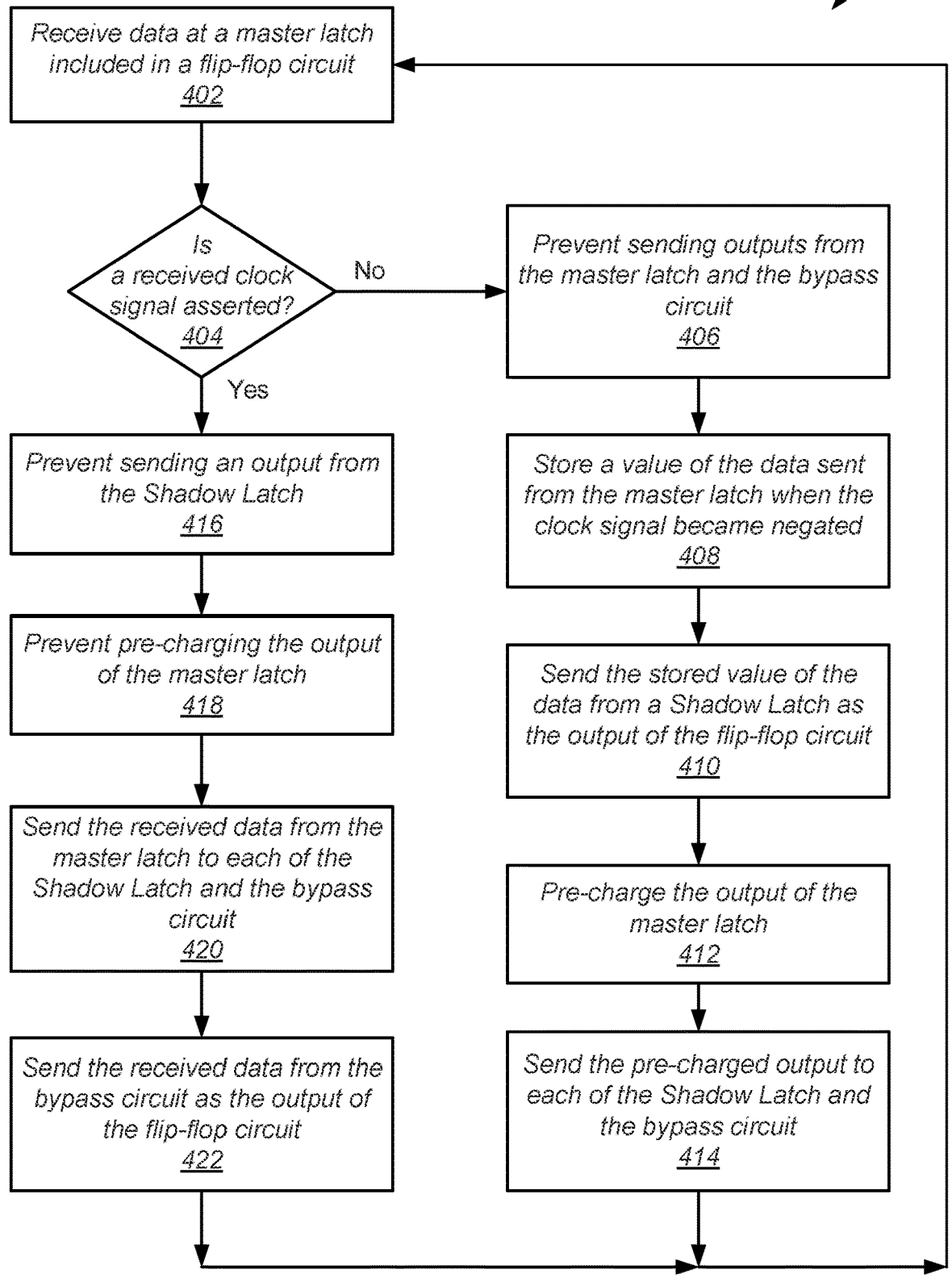
FIG. 4 is a flow diagram of one embodiment of a method for efficiently storing and driving data between pipeline stages.

Referring now to FIG. 4, a generalized flow diagram of one embodiment of a method 400 for efficiently handling instruction execution ordering is shown. For purposes of discussion, the steps in this embodiment (as well as for FIG. 6) are shown in sequential order. However, in other embodiments some steps may occur in a different order than shown, some steps may be performed concurrently, some steps may be combined with other steps, and some steps may be absent.

Data is received at a master latch included in a flip-flop circuit (block 402). In some embodiments, the master latch uses a combination of a clock signal and one or more delayed versions of the clock signal to determine when the master latch is transparent. In other embodiments, the master latch uses a pulse signal and one or more delayed version of the pulse signal to determine when the master latch is transparent. If a received clock signal is negated (de-asserted) ("no" branch of the conditional block 404), then outputs from the master latch and a bypass circuit are prevented from being sent (block 406). For example, tri-state inverters or other circuitry are used to prevent sending the outputs.

A value of the data sent from the master latch is stored when the clock signal became negated (block 408). For example, a sequential feedback circuit latches the data value. In some embodiments, the sequential feedback circuit uses a tri-state inverter that receives delayed clock inputs. The stored value of the data is sent from a shadow latch as the output of the flip-flop circuit (block 410). For example, the shadow latch receives the stored value of the master latch, an input stage of the shadow latch closes, and back-end of the shadow latch becomes open (transparent) when the clock signal is negated. In some embodiments, the back-end of the shadow latch uses a sequential feedback circuit using a tri-state inverter that receives inverted values of the clock signal.

The output of the master latch is pre-charged with the negated clock signal (block 412). Therefore, the flip-flop circuit is a semi-dynamic flip-flop circuit, since the master latch uses dynamic logic while the shadow latch uses static logic. Typically, semi-dynamic flip-flop circuits remove low-to-high (rising) transitions from the critical path, and consequently, have transparency on only one input data transition. Here, the flip-flop circuit uses semi-dynamic circuitry with transparency for both input data transitions. The pre-charged output is sent to each of the shadow latch and the bypass circuit (block 414).

If a received clock signal is asserted ("yes" branch of the conditional block 404), then the output from the shadow latch is prevented from being sent as the output of the flip-flop circuit (block 416). Pre-charging of the output of the master latch is prevented (block 418). The received data from the master latch is sent to each of the shadow latch and the bypass circuit (block 420). The received data is sent from the bypass circuit as the output of the flip-flop circuit (block 422). When the clock signal is asserted, the path from the output of the master latch through the bypass circuit to the output of the flip-flop circuit reduces the clock-to-output delay of the flip-flop circuit.

Figure 5:
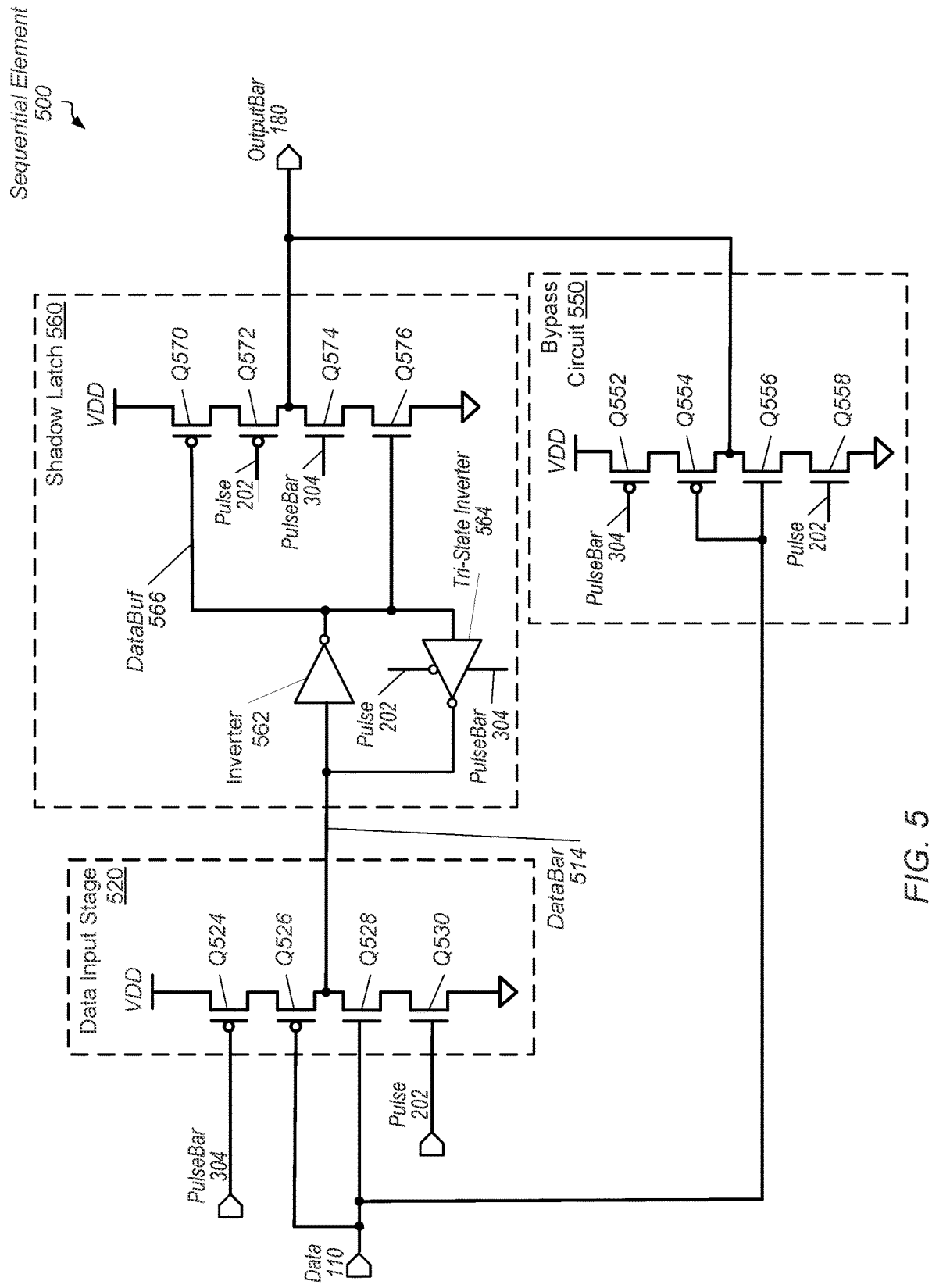
FIG. 5 is a block diagram of another embodiment of a sequential element.

Referring to FIG. 5, a generalized block diagram of another embodiment of a sequential element 500 is shown. As shown, sequential element 500 receives Pulse 202 and PulseBar 304 without receiving source Clock 102. Rather than receive Clock 102, the data input stage 520 of the sequential element 500 uses Pulse 202 and the inverted level of Pulse 202, which is PulseBar 304. Pulse 202 is received on the gate terminal of device Q530 (an NFET) and Pulse-Bar 304 is received on the gate terminal of device Q524 (a PFET). The pulse width of Pulse 202 is used to determine a transparency window for sequential element 500. In the illustrated embodiment, the data input stage 520 receives Data 110 on the gate terminals of devices Q526 (a PFET) and Q528 (an NFET).

The data input stage 520 does not use dynamic logic, so there is no pre-charged node. The output of the data input stage 520, which is DataBar 514, is received by shadow latch 560. As shown, shadow latch 560 uses a sequential feedback circuit with inverter 562 and tri-state inverter 564. Tri-state inverter 564 receives both Pulse 202 and PulseBar 304. When Pulse 202 is asserted with a logic high level, the tri-state inverter 564 does not drive a voltage level on its output, which is DataBar 514. In contrast, when Pulse 202 is negated with a logic low level, the tri-state inverter 564 drives the inverted level of DataBuf 566 on its output DataBar 514. After the sequential feedback circuit with gates 562 and 564, the final tri-state stage in shadow latch 560 receives Pulse 202 on the gate terminal of Q572 (a PFET) and PulseBar 304 on the gate terminal of Q574 (an NFET). The voltage level of DataBuf 566 is received on the gate terminal of Q570 (a PFET) and on the gate terminal of Q576 (an NFET).

In the illustrated embodiment, the bypass circuit 550 directly receives Data 110. As shown, Data 110 is received on the gate terminal of Q554 (a PFET) and on the gate terminal of Q556 (an NFET). The bypass circuit 550 receives Pulse 202 on the gate terminal of Q558 (an NFET) and PulseBar 304 on the gate terminal of Q552 (a PFET). When Pulse 202 is asserted, the path from Data 110 through the bypass circuit 550 (skipping the data input stage 520) to Output 180 reduces the clock-to-output delay of sequential element 500 while also providing a smaller setup time.

Figure 6:
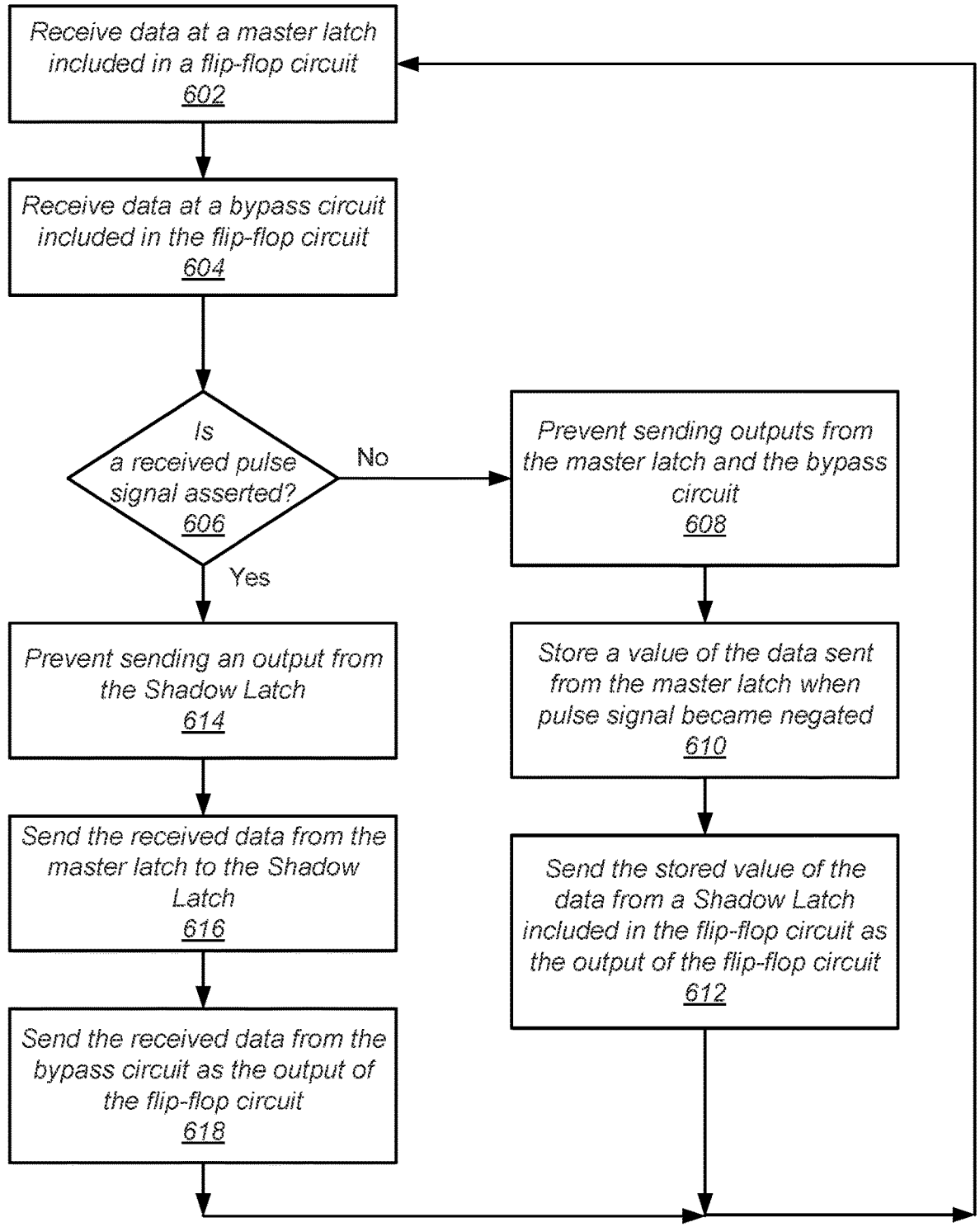
FIG. 6 is a flow diagram of one embodiment of a method for efficiently storing and driving data between pipeline stages.

Referring now to FIG. 6, a generalized flow diagram of one embodiment of a method 600 for efficiently handling instruction execution ordering is shown. Data is received at a master latch included in a flip-flop circuit (block 602). Data is received at a bypass circuit included in the flip-flop circuit (block 604). It is noted that the bypass circuit does not receive an output of the master latch, but rather, directly receives the input data signal.

If a received pulse signal is negated (de-asserted) ("no" branch of the conditional block 606), then outputs from the master latch and the bypass circuit are prevented from being sent (block 608). For example, tri-state inverters or other circuitry are used to prevent sending the outputs. A value of the data sent from the master latch is stored when the pulse signal became negated (block 610). For example, a feedback circuit latches the data value. In various embodiments, the feedback circuit uses tri-state inverter with no clock inputs. The stored value of the data is sent from a shadow latch included in the flip-flop circuit as the output of the flip-flop circuit (block 612).

If a received pulse signal is asserted ("yes" branch of the conditional block 606), then the output from the shadow latch is prevented from being sent as the output of the flip-flop circuit (block 614). The received data from the master latch is sent to the shadow latch (block 616). The received data is sent from the bypass circuit as the output of the flip-flop circuit (block 618). In some embodiments, the bypass circuit is a tri-state inverter with each of the rising input data transition and the falling input data transition gated by a pulse signal. When the received pulse signal is asserted, the path from the input data signal through the bypass circuit (skipping the master latch) to the output of the flip-flop circuit reduces the clock-to-output delay of the flip-flop circuit.

Figure 7:
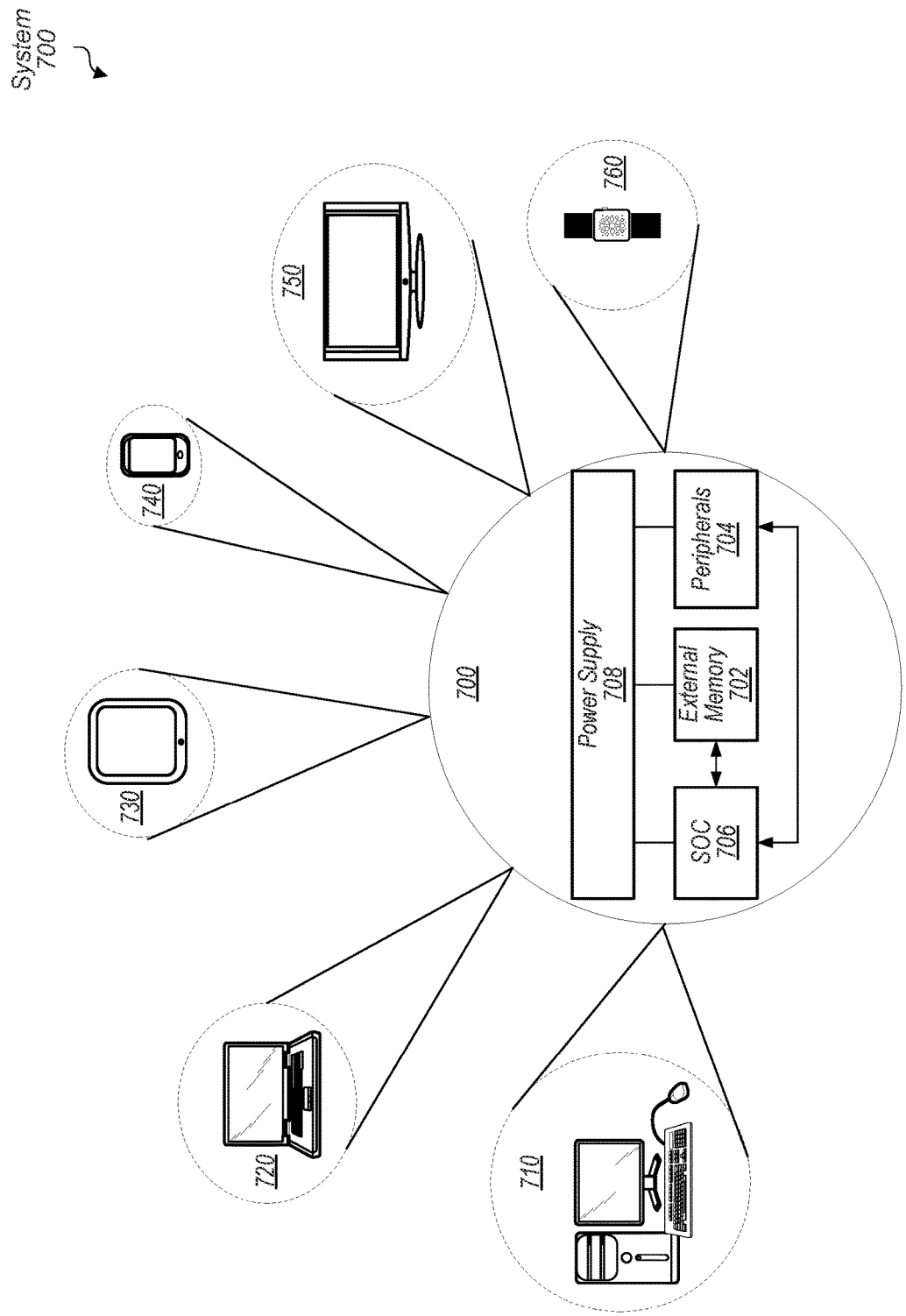
FIG. 7 is a block diagram of one embodiment of a system.

Turning next to FIG. 7, a block diagram of one embodiment of a system 700 is shown. As shown, system 700 represents chip, circuitry, components, etc., of a desktop computer 710, laptop computer 720, tablet computer 730, cell or mobile phone 740, television 750 (or set top box coupled to a television), wrist watch or other wearable item 760, or otherwise. Other devices are possible and are contemplated. In the illustrated embodiment, the system 700 includes at least one instance of a system on chip (SoC) 706 which includes multiple types of processing units, such as a central processing unit (CPU), a graphics processing unit (GPU), or other, a communication fabric, and interfaces to memories and input/output devices. In some embodiments, one or more processors in SoC 706 includes multiple sequential elements between processor pipeline stages similar to sequential elements 100, 300 and 500 as illustrated in FIG. 1, FIG. 3 and FIG. 5. In various embodiments, SoC 706 is coupled to external memory 702, peripherals 704, and power supply 708.

A power supply 708 is also provided which supplies the supply voltages to SoC 706 as well as one or more supply voltages to the memory 702 and/or the peripherals 704. In various embodiments, power supply 708 represents a battery (e.g., a rechargeable battery in a smart phone, laptop or tablet computer). In some embodiments, more than one instance of SoC 706 is included (and more than one external memory 702 is included as well).

The memory 702 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 704 include any desired circuitry, depending on the type of system 700. For example, in one embodiment, peripherals 704 includes devices for various types of wireless communication, such as Wi-Fi, Bluetooth, cellular, global positioning system, etc. In some embodiments, the peripherals 704 also include additional storage, including RAM storage, solid state storage, or disk storage. The peripherals 704 include user interface devices such as a display screen, including touch display screens or multi-touch display screens, keyboard or other input devices, microphones, speakers, etc.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist including a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. An apparatus comprising:
   a first latch configured to receive a data signal, a clock signal, and a pulse clock signal distinct from, and concurrent with, the clock signal;
   a bypass circuit configured to receive the clock signal and a first output of the first latch; and
   a second latch configured to receive the first output of the first latch and the clock signal; and
   wherein the bypass circuit is configured to convey a second output of the bypass circuit as an output of the apparatus, based at least in part on a determination that the clock signal is asserted.

2. The apparatus as recited in claim 1, wherein based at least in part on the determination that the clock signal is asserted, the second latch is configured to prevent conveyance of a third output of the second latch as the output of the apparatus.

3. The apparatus as recited in claim 1, wherein based at least in part on a determination that the clock signal is negated, the first latch is configured to pre-charge the first output of the first latch.

4. The apparatus as recited in claim 1, wherein based at least in part on a determination that the clock signal is negated:
   the second latch is configured to convey a third output of the second latch as the output of the apparatus; and
   the bypass circuit is configured to prevent conveyance of the second output of the bypass circuit as the output of the apparatus.

5. The apparatus as recited in claim 1, wherein a first sequential feedback circuit in the first latch and a second sequential feedback circuit in the second latch are configured to receive the clock signal.

6. The apparatus as recited in claim 5, wherein the first latch comprises a data input stage configured to:
   receive the data signal and the pulse clock signal; and
   convey the first output of the first latch as an inverted value of the data signal to the first sequential feedback circuit, the bypass circuit, and the second latch.

7. The apparatus as recited in claim 6, wherein the second output of the bypass circuit is a non-inverted value of the data signal.

8. The apparatus as recited in claim 1, wherein the pulse clock signal is generated from the clock signal.

9. A method, comprising:
   receiving, by a first latch of a sequential element, a data signal, a clock signal, and a pulse clock signal distinct from, and concurrent with, the clock signal;
   receiving, by a bypass circuit of the sequential element, the clock signal and a first output of the first latch;
   receiving, by a second latch of the sequential element, the first output of the first latch and the clock signal;

conveying, by the bypass circuit, a second output of the bypass circuit as an output of the sequential element, in response to determining the clock signal is asserted.

10. The method as recited in claim 9, further comprising preventing, by the second latch, conveyance of a third output of the second latch as the output of the sequential element, in response to determining the clock signal is asserted.

11. The method as recited in claim 9, wherein the method comprises, in response to determining the clock signal is negated:
    conveying, by the second latch, a third output of the second latch as the output of the sequential element; and
    preventing conveyance, by the bypass circuit, of the second output of the bypass circuit as the output of the sequential element.

12. The method as recited in claim 9, further comprising receiving the clock signal by a first sequential feedback circuit in the first latch and a second sequential feedback circuit in the second latch.

13. The method as recited in claim 12, further comprising:
    receiving, by a data input stage of the first latch, the data signal and the pulse clock signal; and
    conveying, by the data input stage of the first latch, the first output of the first latch as an inverted value of the data signal to the first sequential feedback circuit, the bypass circuit and the second latch.

14. The method as recited in claim 9, wherein the pulse clock signal is generated from the clock signal.

15. A system on a chip comprising:
    circuitry configured to implement functionality of a processing unit comprising a plurality of pipeline stages;
    a plurality of sequential elements between the plurality of pipeline stages, wherein one or more of the plurality of sequential elements comprises:
        a first latch configured to receive a data signal, a clock signal, and a pulse clock signal distinct from, and concurrent with, the clock signal;
        a bypass circuit configured to receive the clock signal and a first output of the first latch; and
        a second latch configured to receive the first output of the first latch and the clock signal; and
        wherein the bypass circuit is configured to convey a second output of the bypass circuit as an output of the sequential element, based at least in part on a determination that the clock signal is asserted.

16. The system on chip as recited in claim 15, wherein based at least in part on the determination that the clock signal is asserted, the second latch is configured to prevent conveyance of a third output of the second latch as the output of the sequential element.

17. The system on chip as recited in claim 15, wherein based at least in part on a determination that the clock signal is negated, the first latch is configured to pre-charge the first output of the first latch.

18. The system on chip as recited in claim 15, wherein based at least in part on a determination that the clock signal is negated:
    the second latch is configured to convey a third output of the second latch as the output of the sequential element; and
    the bypass circuit is configured to prevent conveyance of the second output of the bypass circuit as the output of the sequential element.

19. The system on chip as recited in claim 15, wherein a first sequential feedback circuit in the first latch and a second sequential feedback circuit in the second latch are configured to receive the clock signal.

20. The system on chip as recited in claim 19, wherein the first latch comprises a data input stage configured to:
    receive the data signal and the pulse clock signal; and
    convey the first output of the first latch as an inverted value of the data signal to the first sequential feedback circuit, the bypass circuit, and the second latch.

* * * * *